(12) United States Patent
Mueller

(10) Patent No.: US 6,258,219 B1
(45) Date of Patent: Jul. 10, 2001

(54) TWO-STEP DEPOSITION PROCESS FOR PREVENTING ARCS

(75) Inventor: Mark A. Mueller, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 08/372,701

(22) Filed: Jan. 13, 1995

Related U.S. Application Data

(63) Continuation of application No. 08/119,764, filed on Sep. 9, 1993, now abandoned.

(51) Int. Cl.[7] .................................................. C23C 14/34
(52) U.S. Cl. .............................. 204/192.15; 204/192.17
(58) Field of Search ........................ 204/192.12, 298.11, 204/192.15, 192.17

(56) References Cited

U.S. PATENT DOCUMENTS

| | | | |
|---|---|---|---|
| 3,729,406 | * | 4/1973 | Osborne et al. ................ 204/192.17 |
| 3,856,648 | * | 12/1974 | Fuller et al. ................ 204/192.15 X |
| 4,978,412 | * | 12/1990 | Aoki et al. ................... 204/298.15 X |
| 5,019,234 | * | 5/1991 | Harper .............................. 204/192.17 |
| 5,037,262 | * | 8/1991 | Moll et al. ................... 204/298.15 X |

FOREIGN PATENT DOCUMENTS

| | | | |
|---|---|---|---|
| 0145672 | * | 8/1985 | (JP) ................................. 204/192.17 |
| 0183961 | * | 8/1986 | (JP) ................................. 204/192.17 |

OTHER PUBLICATIONS

Ku et al., "Use in X-ray Masks", J. Vac. Sci Technol. B6(6), Nov./Dec. 1988, p. 2174–2177.*

* cited by examiner

Primary Examiner—Nam Nguyen
(74) Attorney, Agent, or Firm—Thomason, Moser & Patterson, L.L.P.

(57) ABSTRACT

A method of deposition for W or TiW on a silicon wafer in a physical vapor deposition chamber equipped with a clamping ring without incurring arcing problem between the wafer and the clamping ring by utilizing a novel two-step high-pressure/low-pressure process in which a first depositing step is carried out at a relatively high pressure above 11 mTorr so as to form an electrical bridge between the wafer and the clamping ring and a second depositing step is carried out at a lower pressure so as to form a high-quality conductive film.

15 Claims, 1 Drawing Sheet

Figure 1A (Invention)

TWO-STEP DEPOSITION PROCESS FOR PREVENTING ARCS

This is a continuation of application Ser. No. 08/119,764 filed on Sep. 9, 1993, now abandoned.

FIELD OF THE INVENTION

The present invention generally relates to a novel method of deposition for W, TiW or other metals on a silicon wafer and more particularly, relates to a novel method of deposition of a metal on a silicon wafer in a physical vapor deposition chamber equipped with a clamping ring without incurring arcing problem between the wafer and the clamping ring by utilizing a two-step high-pressure/low-pressure process.

BACKGROUND OF THE INVENTION

Physical vapor deposition (PVD) is a frequently used processing technique in the manufacture of semiconductor wafers that involves the deposition of a metallic layer on the surface of a silicon wafer. It is also known as sputtering. In recently developed advanced semiconductor devices, PVD is used to deposit metallic layers of W and TiW as contact layers.

In a PVD process, inert gas particles, such as argon, are first ionized in an electric field producing a gas plasma and are attracted toward a source or target where the energy of these gas particles physically dislodges, or sputters off, atoms of the metallic or other source material. PVD is a versatile technique in that many materials can be deposited using not only RF but also DC power sources.

In a typical PVD process chamber, major components include a stainless steel chamber that is vacuum-tight and equipped with a helium leak detector, a pump with the capacity to reduce the chamber pressure to $10^{-6}$ Torr or below, pressure gauges, a sputter source or target, a power supply, a wafer holder, and a clamping ring. The sputter source and the wafer holder are positioned facing each other. The target is a W or TiW disc when sputtering of W or TiW is desired. Such a sputter source is the Endura® 5500 available from Applied Materials, Inc. of Santa Clara, Calif. In some systems, the wafer holder is a pedestal including an internal resistive heater.

The clamping ring serves two purposes in the process chamber. The first purpose is to clamp the wafer to the heater. This holds the wafer in place on the pedestal when a positive gas pressure is applied between the heater and the pedestal and thus allows heat to effectively conduct between the wafer and the heater. The second purpose is to create a predetermined leak rate of argon from under the wafer into the process chamber.

The clamping ring is circular in shape and has an oriented cut-out match the wafer's flat contour. A hood is built into the clamping ring which is used for shadowing purpose. Shadowing protects the lip of the clamping ring from being coated by the deposited metal material. The lip allows the force of the clamping ring to be distributed evenly around the wafer.

When a W, TiW or other metal target is used in a PVD chamber, the emission of sputtered W or TiW is shaped with a forward cosine distribution. As a consequence, the W or TiW film is deposited uniformly at the center and edge parts of the wafer, but this film does not penetrate to cover the areas under the hood. As the deposition process progresses, a differential in voltages between the clamping ring and the wafer surface causes discharging or arcing between those two members. When arcing occurs, severe damage is done to the wafer which causes a significant part of the wafer or possibly the entire wafer to be scrapped.

Others have attempted to prevent arcing problem in a PVD process by making modifications to the processing equipment. For instance, some have cut down the hood area of the clamping ring such that atoms can reach under the hood more easily to thus form a bridge between the clamping ring and the silicon wafer surface which avoids arcing. However, an excessive bridge formation between the clamping ring and the wafer surface can cause a particulate contamination problem for the wafer. Others have attempted to modify the magnetron power source forming and shaping the plasma by changing the magnets in order to reduce electron bombardment. This involves major equipment modifications and re-qualification of the equipment for certain processes.

It is therefore an object of the present invention to provide a novel method of depositing W, TiW, or other metal on silicon wafers in a PVD chamber without the arcing problem while avoiding the shortcomings of the prior art methods.

It is another object of the present invention to provide a W or TiW deposition process in a PVD chamber without the arcing problem and without making modifications to the processing equipment.

It is yet another object of the present invention to provide a novel method of depositing metal on silicon wafers in a PVD chamber without the arcing problem by incorporating a simple process modification.

It is a further object of the present invention to provide a novel method of depositing a metal on silicon wafers in a PVD chamber without the arcing problem by using a two-step high-pressure/low-pressure deposition process.

SUMMARY OF THE INVENTION

In accordance with the present invention, a novel method of depositing W, TiW or other metal films on silicon wafers by a sputtering technique without the arcing problem is provided.

In the preferred embodiment, the novel deposition technique for W or TiW without the occurrence of arcing is carried out in a two-step high-pressure/low-pressure process. A process chamber is first purged with an inert gas such as argon or helium. The deposition of W or TiW is then conducted at a high chamber pressure of greater than 11 mTorr for at least 5 seconds. The chamber pressure is then reduced to below 11 mTorr, where the deposition process continues until such a time that a sufficient thickness of W or TiW film is built up. The deposition power used can be any power in the range between 1 and 12 kW for a 13-inch (33 cm) target.

The first-step, high-pressure process for W or TiW builds up a conducting bridge in the clamping ring shadow area such that the voltage differential between the wafer and the clamping ring can be discharged without arcing. This first-step, high-pressure process is then supplemented by a low-pressure process to produce a semiconductor film that has superior properties and without high residual stress.

BRIEF DESCRIPTION OF THE DRAWINGS

Other objects, features and advantages of the present invention will become apparent upon consideration of the specification and the appended drawings, in which:

FIGS. 1A and 1B are illustrations showing a silicon wafer of the invention and a silicon wafer of the prior art with arcing damage.

DETAILED DESCRIPTION OF THE PREFERRED EMBODIMENTS

The present invention discloses a novel method of a two-step high-pressure/low-pressure deposition process for a metal, such as W or TiW, in a PVD chamber without the occurrence of arcing problems.

Figure 1B:
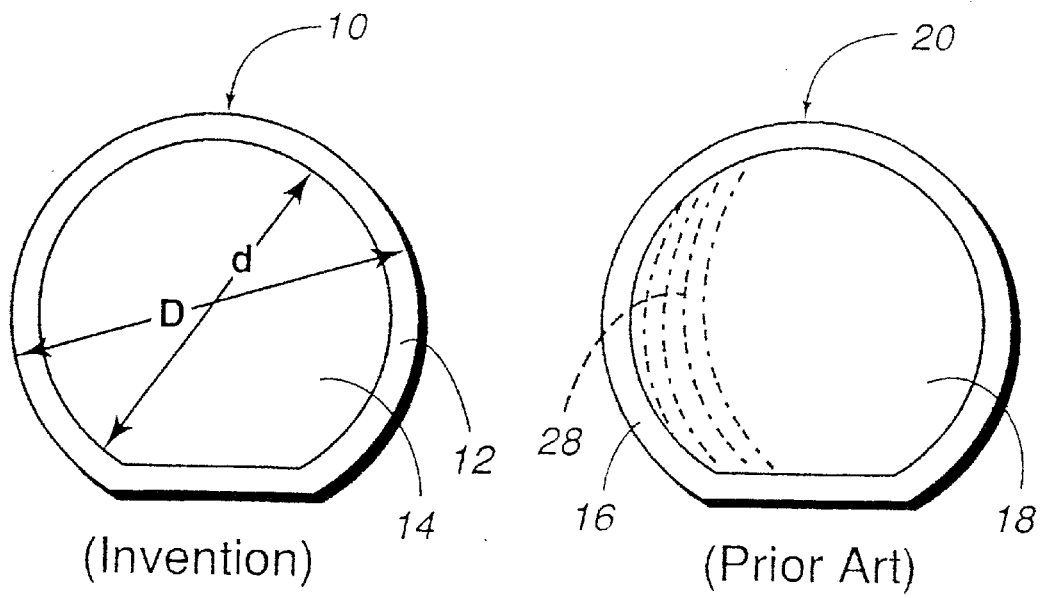
Figure 2:
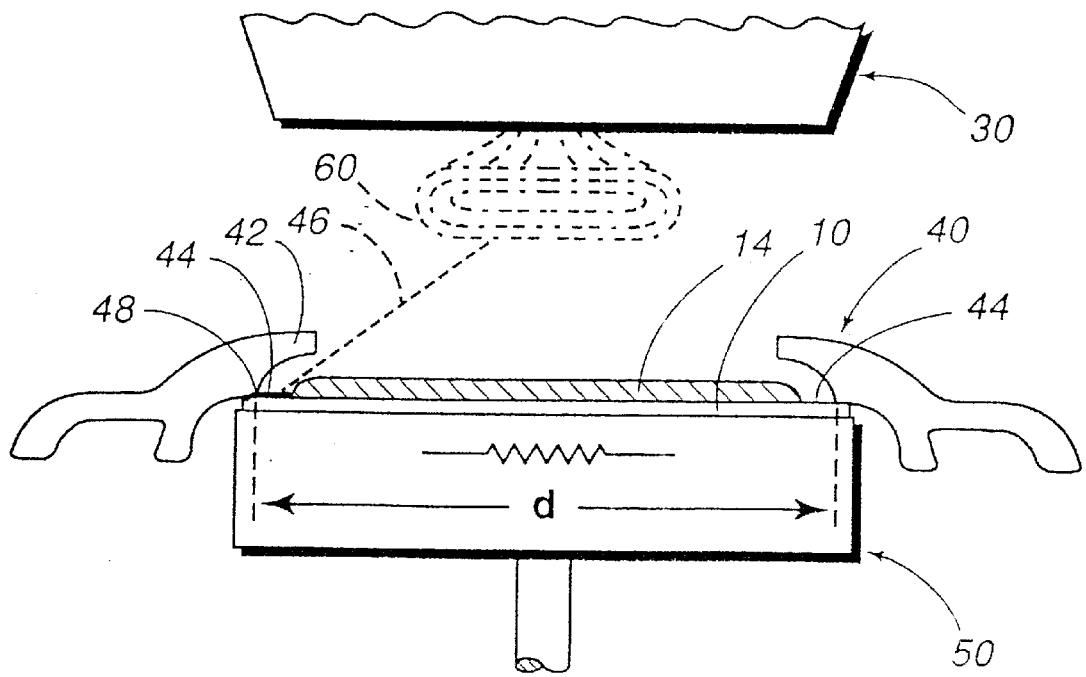
FIG. 2 is an illustration showing the cross-sectional views of a target, a silicon wafer and a clamping ring.

Referring initially to FIGS. 1A and 1B, a silicon wafer 10 and a silicon wafer 20 are shown. Silicon wafer 10 has a diameter of D, a total surface area 12 and a smaller W or TiW film 14 formed thereover. Similarly, wafer 20 of the prior art has a total surface area 16, a W or TiW film 18, and an arc-damaged area 28. FIG. 2 shows clamping ring 40 which has a diameter of d at the point of contact with wafer 10. The outer peripheral area on either the present invention wafer 10 or prior-art 20 is not deposited with a film of semiconductor material.

FIG. 2 also shows the cross-sectional views of target 30 and heater assembly 50. The hood 42 of clamping ring 40 is an important design feature of the ring. It acts as a shield and thus prevents a thick film depositing in peripheral wafer area 44 such that wafer 10 and clamping ring 40 would otherwise be welded together. In an ideal deposition process, a predetermined thickness of film 14 should be deposited on wafer 10 but the deposition at peripheral area 44 should be controlled. When welding occurs between clamping ring 40 and wafer 10, severe contamination by particles occurs when the wafer 10 is broken from the ring 40, which leads to low yield of wafer production. A controlled number of particles 46 can be deposited at peripheral area 44 to form a thin film 48.

In a sputtering process, the shape of the sputtered material distribution 60 shown in FIG. 2 is different for different semiconductor materials. For instance, the sputter distribution of aluminum has a fairly forward cosine distribution, i.e., in the shape of a cone. Tungsten, on the other hand, has the most forward cosine distribution shape among all semiconductor materials. Since the clamping ring 40 is electrically connected to heater 50, it maintains the same floating voltage of approximately −25 volts as the heater. Silicon wafer 10 is electrically non-conductive, so that it carries a voltage different than that carried by the clamping ring. Arcing occurs at the point when deposited metal film 48 starts to bridge over between clamping ring 40 and wafer 10.

A typical pattern of damage by arcing on a silicon wafer is shown in FIG. 1B as area 28 on wafer 20. During arcing, a large number of particles are showered on top of the wafer surface which contaminates the wafer. Arcing can cover an area as wide as 0.5 cm on the edge of a wafer. Damage caused by arcing severely reduces the yield of a wafer production process.

It has been observed that arcing normally occurs only once, for instance, at approximately 30 seconds after the start of a deposition process when low chamber pressure is used. Once an electrical contact is made between clamping ring 40 and wafer 10 by the bridging film 48, electricity is discharged without arcing.

In order to prevent arcing, the cause of arcing must first be determined. Plasma cloud 60 shown in FIG. 2 is generated by cascading ionizing reaction in which electrons and ion pairs are formed. For instance, when an electron bumps into an argon atom, it forms an argon ion and another electron. This newly formed electron then collides with another argon atom and causes a chain reaction or ionization. At very high chamber pressure, e.g. at 50 mTorr, there is no need to confine the plasma cloud. At low chamber pressures, the plasma cloud must be confined such that electrons can be contained within the cloud to create more ion pairs.

When electrons bombard a wafer surface, the surface of the wafer can be charged to a negative voltage higher than 30 volts. It is therefore desirable to confine the electrons within a plasma cloud such that electron bombardment on the wafer surface is reduced. When such electron bombardment is reduced, the charge on the wafer surface as well as the voltage differential between the wafer and the clamping ring are also reduced. As a result, the likelihood of arcing is reduced.

The present invention teaches a novel two-step high-pressure/low-pressure deposition process which effectively prevents arcing. In the first, high-pressure process, i.e. at pressures higher than 11 mTorr, the mean-free-path for the electrons is reduced due to the high pressure. This leads to a more confined plasma cloud and consequently, lesser electron bombardment on the wafer surface. A smaller voltage buildup results on the wafer surface and arcing between wafer surface and clamping ring is avoided.

During this first, high-pressure process, a deposition layer 48 is formed under hood 42 to bridge over clamping ring 40 and wafer 10. Once the bridge is formed, the likelihood of arcing is eliminated between the clamping ring and the wafer.

It was discovered that while the high-pressure process confines the electron, thus reducing the voltage differential between the wafer and the clamping ring, and forming the necessary bridge between the two members, a high-pressure process alone produces films of inferior property if such high pressure is kept throughout the deposition process. The inferior property is caused by high stress and possible gas entrapment in the film during the high-pressure deposition process.

The present invention therefore employs a second, low-pressure deposition step after the first high-pressure deposition step. In the second low-pressure process, the pressure of the chamber is reduced to an optimum pressure less than 11 mTorr, and the deposition process is continued until a sufficient thickness of the semiconductor film is deposited on the wafer.

This novel combination of a high-pressure process and a low-pressure process produces films of superior quality without the residual stress problem. The high-pressure process step eliminates any potential arcing problem, while the second, low-pressure step ensures the formation of a high-quality semiconductor film.

A series of tests has been conducted to determine the pressure levels required for the prevention of arcing. These data are shown in Table I. It is seen that at pressure levels below 10 mTorr, arcing occurred on all wafers. Arcing is most severe at 2 and 4 mTorr. At pressure levels of 12 mTorr or higher, i.e., at 12, 14, and 16 mTorr, no arcing was observed on wafers.

TABLE I

| Test# | Chamber Pressure, mTorr | Result |
|---|---|---|
| 1 | 2 | Severe Arcing |
| 2 | 4 | Severe Arcing |
| 3 | 6 | Arcing |
| 4 | 8 | Arcing |

TABLE I-continued

| Test# | Chamber Pressure, mTorr | Result |
| --- | --- | --- |
| 5 | 10 | Little Arcing |
| 6 | 12 | No Arcing |
| 7 | 14 | No Arcing |
| 8 | 16 | No Arcing |

A series of tests was also conducted by holding the pressure constant at 10 mTorr while changing the deposition power. The data obtained is shown in Table II. It is seen that by varying the power level for deposition, from a low power of 1 kW to a high power of 3 kW for a 13-inch (33 cm) diameter target (tests were run for different time periods), power has no effect on the prevention of arcing.

TABLE II

| | Deposition Time. Sec | | |
| --- | --- | --- | --- |
| Test# | Low Power (1 kW) | High Power (3 kW) | Result |
| 1 | 5 | 30 | Arcing |
| 2 | 10 | 30 | Arcing |
| 3 | 15 | 30 | Arcing |

Table III shows a series of tests where chamber pressures were varied from 14 mTorr in the first step to 3 mTorr in the second step. The power for deposition was kept constant at 3 kW. It is seen that when the test was conducted at 14 mTorr for 10 seconds and then 3 mTorr for 20 seconds, data consistently show that no arcing was observed.

TABLE III

| | Deposition Time. Sec | | |
| --- | --- | --- | --- |
| Test# | High Pressure (14 mTorr) | Low Pressure (3 mTorr) | Result |
| 1 | 2 | 28 | Arcing |
| 2 | 5 | 25 | Little Arcing |
| 3 | 10 | 20 | No Arcing |
| 4 | 10 | 20 | No Arcing |
| 5 | 10 | 20 | No Arcing |
| 6 | 10 | 20 | No Arcing |

A typical process of the present invention comprises a first, high-pressure step at 12 mTorr for 10 seconds, and a second, low-pressure step at 6 mTorr for 20 seconds. It has been found that for TiW, a 30 seconds total deposition time produces a film thickness of approximately 120 nm. It was also found that for the high-pressure process, any pressure higher than 11 mTorr can be used. The deposition time required for the high-pressure process is in the range between 5 to 20 seconds, preferably between 6 to 16 seconds and more preferably between 8 to 12 seconds. The low-pressure process can be conducted at any pressure lower than 11 mTorr, for a length of time that is necessary to build up the film thickness desired. This length of time is at least 10 seconds and more preferably, at least 15 seconds. By using the novel high-pressure/low-pressure deposition process, arcing problem can be avoided while desirable film characteristics such as low residual stress, good barrier property, and desirable crystal size can be achieved.

While the present invention has been described in an illustrative manner, it should be understood that the terminology used is intended to be in a nature of words of description rather than of limitation.

Furthermore, while the present invention has been described in terms of a preferred embodiment utilizing Ti and TiW, it is to be appreciated that those skilled in the art will readily apply these teachings to other possible variations of the invention. In particular, any other types of conductive sputtered materials or any other metals would enjoy the same advantages, and any other types of sputtering processes and rings contacting a substrate.

The embodiments of the invention in which an exclusive property or privilege is claimed are defined as follows.

What is claimed is:

1. A method of depositing a metal layer on the surface of a semiconductor substrate having a periphery in a physical vapor deposition chamber comprising
    a) positioning a shield adjacent to the periphery of a substrate,
    b) depositing a metal from a target therefor onto said substrate at a first relatively high pressure sufficient to avoid arcing between said substrate and said shield,
    c) reducing the chamber pressure to a second, lower pressure so that good quality metal layers are deposited, and
    d) continuing to deposit said metal layer at said second pressure until a desired thickness is obtained.

2. A method according to claim 1 wherein the deposition of step b) is continued until a conductive bridge is formed between said shield and said substrate.

3. A method according to claim 1 wherein said metal is W or TiW.

4. A method according to claim 1 wherein said first pressure is over 11 millitorr.

5. A method according to claim 4 wherein said second pressure is below 11 millitorr.

6. A method of depositing a metal layer on the surface of a semiconductor wafer having a periphery in a physical vapor deposition chamber comprising
    a) positioning a shield adjacent to the periphery of a wafer,
    b) depositing said metal at a first pressure of over 11 millitorr for a time sufficient to form a conductive bridge between said shield and said wafer,
    c) reducing the pressure to a pressure below 11 millitorr, and
    d) continuing to deposit said metal at the pressure of step c) until a desired layer thickness is obtained.

7. A method according to claim 6 wherein the deposition step of step b) is continued for about 5–20 seconds.

8. A method according to claim 6 wherein the deposition step of step d) is continued for at least about 10 seconds.

9. A method according to claim 6 wherein said metal is W or TiW.

10. A method of avoiding arcing during physical vapor deposition of a metal from a target therefor onto a wafer having a periphery surrounded by a shield therefor, said shield having a lip that shadows the periphery of said wafer during said sputter deposition which comprises
    a) sputter depositing said metal at a first pressure so as to form a conductive bridge between said wafer and said shield,
    b) reducing the pressure to a second pressure that will deposit high quality metal layers, and
    c) continuing to deposit said metal at said second pressure until a desired layer thickness is obtained.

11. A method according to claim 10 wherein said metal is W or TiW.

12. A method according to claim 10 wherein said conductive bridge is formed below said lip.

13. A method according to claim 10 wherein said first pressure is above about 11 millitorr.

14. A method according to claim 13 wherein said second pressure is below about 11 millitorr.

15. A method according to claim 10 wherein said conductive bridge is formed between the edge of said wafer and said shield.

* * * * *

UNITED STATES PATENT AND TRADEMARK OFFICE
CERTIFICATE OF CORRECTION

PATENT NO. : 6,258,219 B1
DATED : July 10, 2001
INVENTOR(S) : Mark Mueller

Page 1 of 1

It is certified that error appears in the above-identified patent and that said Letters Patent is hereby corrected as shown below:

<u>Title page,</u>
References Cited, U.S. PATENT DOCUMENTS,
Line 2, please replace "204/192.15 X" with -- 204/192.15 XR --.
Line 3, please replace "204/298.15 X" with -- 204/298.15 XR --.
Line 5, please replace "204/298.15 X" with -- 204/298.15 XR --.

<u>Column 4,</u>
Line 62, please replace "Pressure." with -- Pressure, --.

<u>Column 5,</u>
Line 2, please replace "Pressure." with -- Pressure, --.
Line 20, please replace "Time." with -- Time, --.
Line 35, please replace "Time." with -- Time, --.

Signed and Sealed this

Sixteenth Day of April, 2002

*Attest:*

JAMES E. ROGAN
*Attesting Officer*     *Director of the United States Patent and Trademark Office*